United States Patent
Choi

(10) Patent No.: US 7,332,251 B2
(45) Date of Patent: Feb. 19, 2008

(54) PATTERN DECOMPOSITION AND OPTICAL PROXIMITY CORRECTION METHOD FOR DOUBLE EXPOSURE WHEN FORMING PHOTOMASKS

(75) Inventor: Jae Seung Choi, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/617,432

(22) Filed: Dec. 28, 2006

(65) Prior Publication Data

US 2007/0248899 A1    Oct. 25, 2007

(51) Int. Cl.
*G03F 9/00* (2006.01)
(52) U.S. Cl. .............. 430/5; 430/22; 430/30; 716/19
(58) Field of Classification Search .......... 430/5, 430/22, 30; 716/19–21
See application file for complete search history.

(56) References Cited

U.S. PATENT DOCUMENTS

| | | | |
|---|---|---|---|
| 6,787,459 B2 | 9/2004 | Moniwa et al. | |
| 6,934,007 B2 | 8/2005 | Fritze et al. | |
| 2005/0162627 A1 | 7/2005 | Finders et al. | |

FOREIGN PATENT DOCUMENTS

| | | |
|---|---|---|
| JP | 2003-209049 A | 7/2003 |
| JP | 2005-086119 A | 3/2005 |
| KR | 10-2006-0079009 A | 7/2006 |

*Primary Examiner*—Christopher G. Young
(74) *Attorney, Agent, or Firm*—Townsend and Townsend and Crew LLP

(57) ABSTRACT

A pattern decomposition and optical proximity correction method for double exposure comprises defining second exposure patterns by performing a logical operation on target patterns and first exposure patterns, comparing the first and second exposure patterns with the target patterns by performing a logical operation on the first and second exposure patterns, performing optical proximity correction on the first exposure patterns to form fourth exposure patterns, performing the optical proximity correction on the second exposure patterns to form fifth exposure patterns, and comparing the fourth and fifth exposure patterns with the target patterns by performing a logical operation on the fourth and fifth exposure patterns.

15 Claims, 12 Drawing Sheets

PATTERN DECOMPOSITION AND OPTICAL PROXIMITY CORRECTION METHOD FOR DOUBLE EXPOSURE WHEN FORMING PHOTOMASKS

CROSS-REFERENCE TO RELATED APPLICATION

The present application claims priority to Korean patent application No. 10-2006-0036399, filed on Apr. 21, 2006, which is incorporated herein by reference in its entirety.

BACKGROUND OF THE INVENTION

The present invention relates to a method for manufacturing a semiconductor device. More particularly, the present invention relates to a method of optimizing pattern decomposition and optical proximity correction for double exposure when fabricating photomasks.

Due to an increase in the integration degree of a semiconductor device, there is a requirement to form finer patterns through a photolithography process. The photolithography process is used to form circuit patterns on a semiconductor wafer, and generally comprises photoresist coating, exposure, development, and the like. A higher resolution, an optimal depth of focus (DOF), etc. are required to form finer patterns using the photolithography process.

As the patterns become finer such that the size of the patterns approaches the limit of resolution, the patterns are likely to become deformed due to light diffraction and interference from adjacent patterns. The influence of adjacent patterns on a target pattern during exposure is referred to as an optical proximity phenomenon.

One method for alleviating the effects of optical proximity is an optical proximity correction (OPC) method in which the optical proximity phenomenon is corrected by adjusting a width of the pattern or by adding a subsidiary pattern. Another method is a double exposure method in which the exposure is separately performed twice such that adjacent patterns are not exposed at the same time.

BRIEF SUMMARY OF THE INVENTION

Embodiments of the present invention are directed to a method of optimizing pattern decomposition and optical proximity correction for double exposure when forming photomasks. According to the embodiments, the pattern decomposition and optical proximity correction can be easily performed in a short period of time.

In one embodiment, a pattern decomposition and optical proximity correction method for double exposure when forming photomasks comprises: defining first exposure patterns by separating patterns requiring the double exposure from target patterns based on the resolution of an exposing apparatus; defining second exposure patterns by performing a logical operation on the target patterns and the first exposure patterns; comparing the first and second exposure patterns with the target patterns by performing a logical operation on the first and second exposure patterns; performing optical proximity correction on the first exposure patterns to form fourth exposure patterns; performing optical proximity correction on the second exposure patterns to form fifth exposure patterns; and comparing the fourth and fifth exposure patterns with the target patterns by performing a logical operation on the fourth and fifth exposure patterns.

Defining the first exposure pattern may comprise: identifying fine patterns having a pitch smaller than the resolution of the exposing apparatus; selecting a predetermined pattern among the identified fine patterns; and selecting other patterns that are separated at least a predetermined distance from the predetermined pattern to define the first exposure patterns.

The other patterns selected as the first exposure patterns may be separated from each other at least a distance of four times the width of each of the other patterns.

Defining the second exposure patterns may comprise performing a logical disjunction (OR) operation on the target patterns and the first exposure patterns.

Comparing the first and second exposure patterns with the target patterns may comprise performing a logical exclusive disjunction (XOR) operation on the first and second exposure patterns to form third exposure patterns; and comparing the third exposure patterns with the target patterns.

The optical proximity correction of the second exposure patterns may be performed in consideration of overlap between the second exposure patterns and the fourth exposure patterns.

The method may further comprise performing contour simulation on the fourth exposure patterns between formation of the fourth exposure patterns and formation of the fifth exposure patterns.

Comparing the fourth and fifth exposure patterns with the target patterns may comprise performing a logical exclusive disjunction (XOR) operation on the fourth and fifth exposure patterns to form sixth exposure patterns; and confirming whether or not the sixth exposure patterns are within an allowable range of error by comparing the sixth exposure patterns with the target patterns.

The method may further comprise performing contour simulation on each of the fourth and fifth exposure patterns before operating the fourth and fifth exposure patterns.

In another embodiment, a pattern decomposition and optical proximity correction method for double exposure when forming photomasks comprises: defining first exposure patterns by separating patterns requiring the double exposure from target patterns based on the resolution of an exposing apparatus; defining second exposure patterns by performing a logical operation on the target patterns and the first exposure patterns; comparing the first and second exposure patterns with the target patterns by performing a logical operation on the first and second exposure patterns; performing optical proximity correction on the first exposure patterns to form fourth exposure patterns; performing contour simulation on the fourth exposure patterns; merging the second exposure patterns with the fourth contour-simulated exposure patterns to form merged patterns; performing the optical proximity correction on the second exposure patterns to form fifth exposure patterns in consideration of overlap between the second exposure patterns and the merged patterns; performing contour simulation on the fifth exposure patterns; and comparing the fourth and fifth exposure patterns with the target patterns by performing a logical operation on the fourth and fifth contour-simulated exposure patterns.

Defining the first exposure patterns may comprise: identifying fine patterns having a pitch smaller than the resolution of the exposing apparatus; selecting predetermined patterns from the identified fine patterns; and selecting other patterns separated at least a predetermined distance from the selected fine patterns to define the first exposure patterns.

The other patterns selected as the first exposure patterns may be separated a distance at least equal to four times the width of each selected fine pattern.

Defining the second exposure patterns may comprise performing a logical disjunction (OR) operation on the target patterns and the first exposure patterns.

Comparing the first and second exposure patterns with the target patterns may comprise performing a logical exclusive disjunction (XOR) operation on the first and second exposure patterns to form third exposure patterns; and comparing the third exposure patterns with the target patterns.

Comparing the fourth and fifth exposure patterns with the target patterns may comprise performing a logical exclusive disjunction (XOR) operation on the fourth and fifth exposure patterns to form sixth exposure patterns; and confirming whether or not the sixth exposure patterns are within an allowable range of error by comparing the sixth exposure patterns with the target patterns.

DESCRIPTION OF THE PREFERRED EMBODIMENTS

Figure 1:
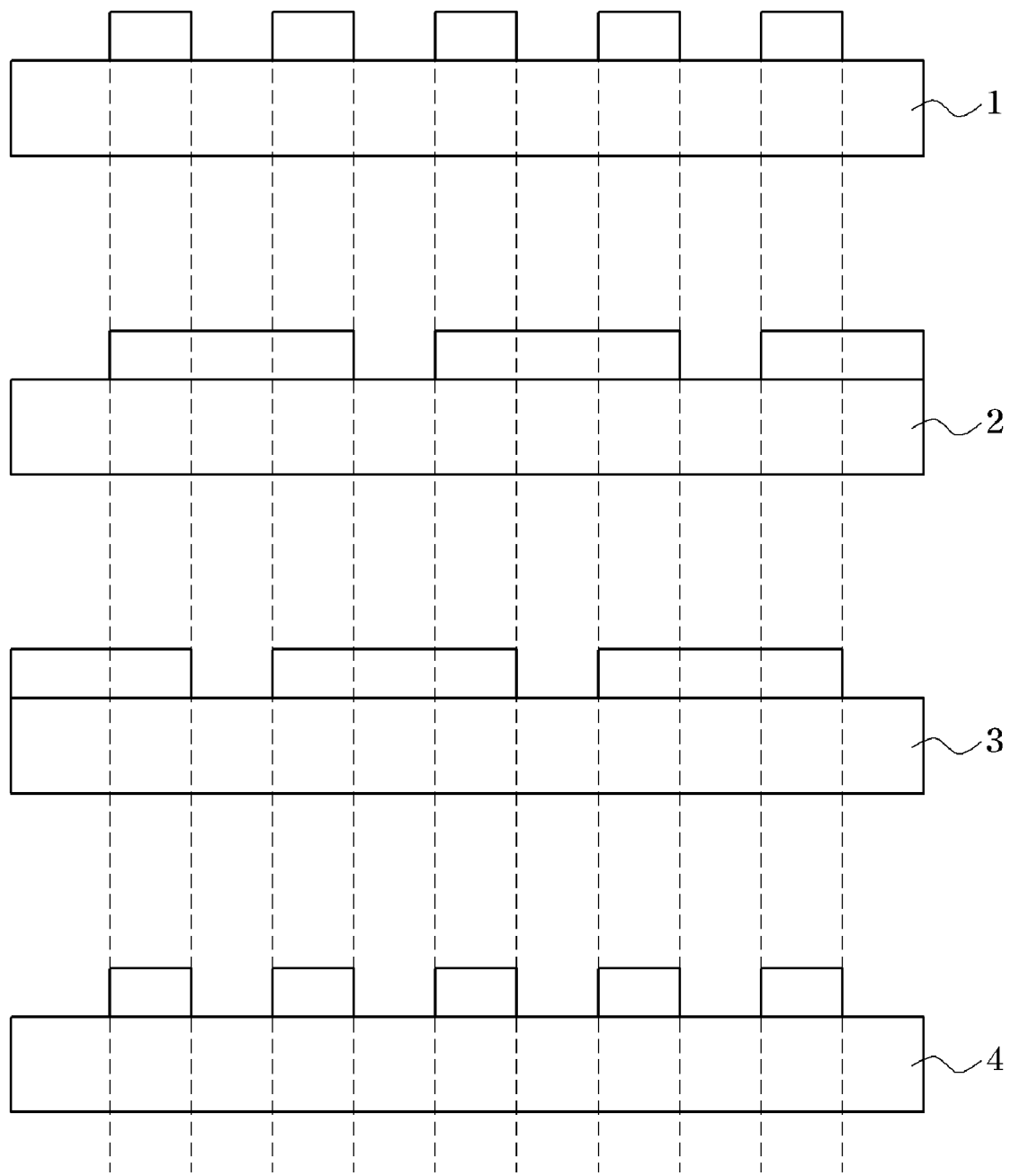
FIG. 1 is a cross-sectional view of patterns in each exposing step of a typical double exposure method.

In a typical double exposure method, an exposing step is repeated twice or more through photomasks, followed by repeating an etching step twice or more corresponding to the respective exposing steps. FIG. 1 is a cross-sectional view of a pattern in each exposing step of a typical double exposure method.

A first photomask 2 and a second photomask 3 are prepared to form desired patterns on a wafer, that is, target patterns 1, using a double exposure method.

Primary exposing and etching are sequentially performed using the first photomask 2. Secondary exposing and etching are sequentially performed using the second photomask 3, thereby forming patterns such as the target patterns 1 on the wafer 4.

The most important double exposure considerations are pattern decomposition to separate the target patterns formed by the respective exposing steps, and optical proximity correction on each of the separated patterns. The optical proximity correction is performed on the overlapping separated patterns to form suitable target patterns.

In the double exposure method, the pattern decomposition and the optical proximity correction generally proceed through repetitious simulations and the manufacture of photomasks by skilled-persons. Such operations are time and cost inefficient. Accordingly, there is a need for methods to perform pattern decomposition and the optical proximity correction efficiently and simply.

Figure 2:
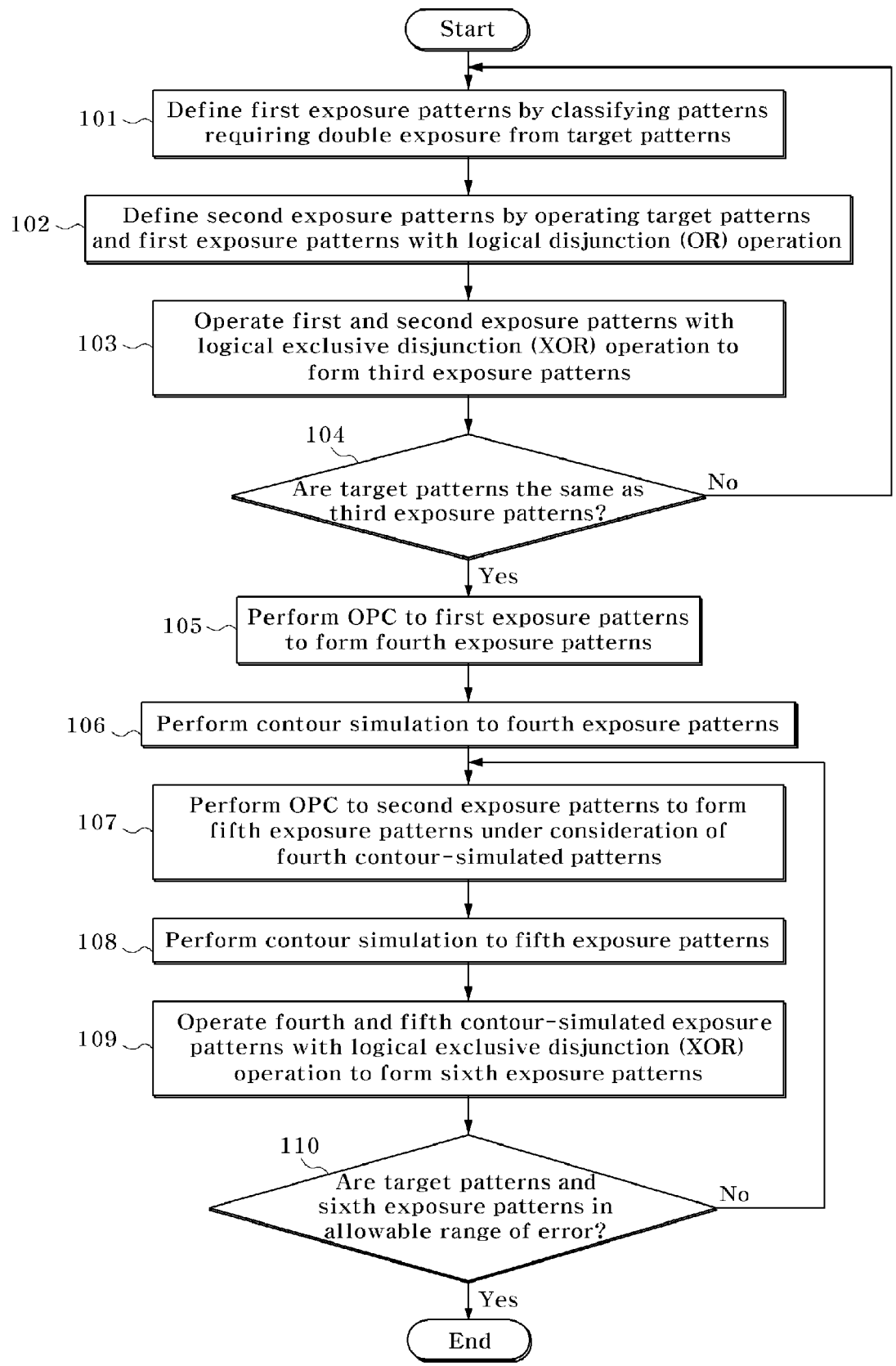
FIG. 2 is a flow chart of a pattern decomposition and optical proximity correction method according to an embodiment of the present invention.

FIG. 2 is a flow chart of a pattern decomposition and optical proximity correction method according to an embodiment of the present invention. FIGS. 3a to 3j are cross-sectional views of patterns of each exposing step of the method according to an embodiment of the present invention.

Figure 3A:
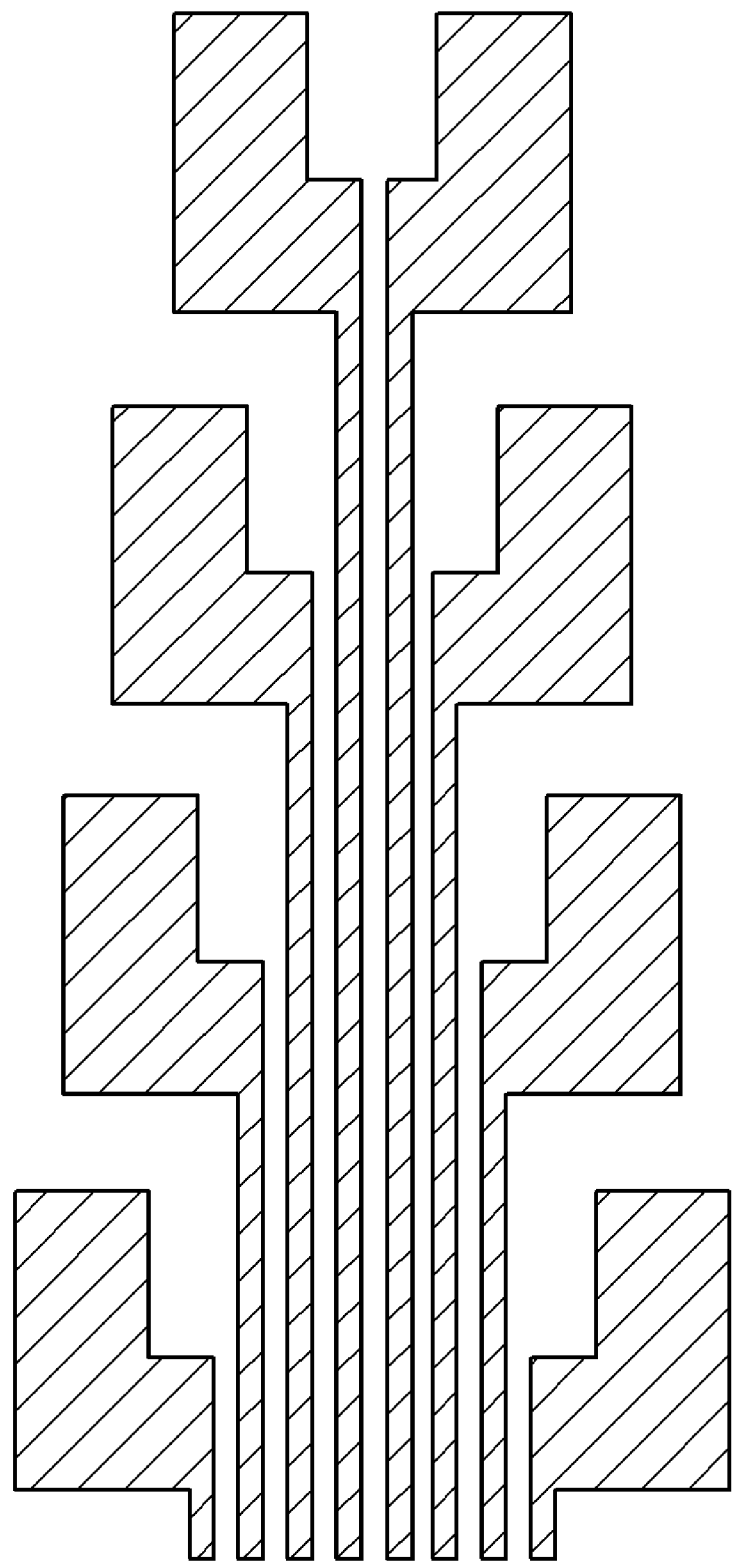
FIGS. 3a to 3j are cross-sectional views of patterns of each exposing step of the method according to the embodiment of the present invention.

When performing a double exposure method, it is necessary to classify target patterns into patterns requiring double exposure and patterns not requiring double exposure. Thus, the patterns requiring double exposure are separated from the target patterns as shown in FIG. 3a. The patterns requiring double exposure are classified based on the resolution of an exposure apparatus.

The term "resolution" refers to the ability of an optical device such as a microscope, telescope or camera lens to determine details of an object as images or the value measured by a spectroscope or a mass spectrometer to show the ability of the optical device to precisely separate images that are close together.

Specifically, the resolution R of the exposure apparatus can be determined by the following Equation:

$$R = k_1 \frac{\lambda}{NA}$$

R: resolution,
$K_1$: Process constant
$\lambda$: Wavelength of illumination light
NA: Numerical Aperture For example, assuming an illumination condition of a wavelength of 193 nm and 0.93 NA, it is possible to resolve an image up to a pitch of about 200 nm. In other words, when forming patterns having a pitch less than 200 nm by single exposure, there is a possibility of an optical proximity phenomenon that causes the patterns to be deformed due to diffraction and interference of light from adjacent patterns. Thus, it is possible to identify fine patterns having a size less than or equal to a limit of the resolvable pitch as the patterns requiring double exposure.

First exposure patterns are defined by selecting a certain pattern from the fine patterns identified as the patterns requiring double exposure. Other patterns that are separated at least a predetermined distance from the selected certain pattern are then selected (101).

The predetermined distance is preferably at least four times the width of each of the other patterns. Specifically, if an adjacent pattern is separated from the certain pattern by a distance of less than or equal to the resolution, another pattern separated from the certain pattern by a distance of at least four times the width of each pattern is selected (the selected pattern is not the adjacent pattern). Therefore, it is possible to select other patterns defined as the first exposure patterns.

Figure 3B:
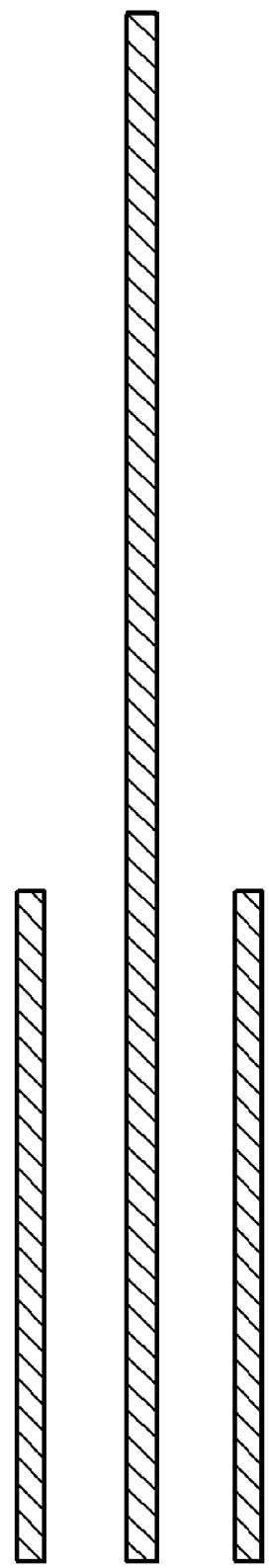

FIG. 3b illustrates an example of the first exposure patterns defined by the above process.

Second exposure patterns may be defined by performing a logic operation on the target patterns (see FIG. 3a) and the first exposure patterns (see FIG. 3b) (102). For example, the second exposure patterns may be defined by performing a logical disjunction (OR) operation on the target patterns (see FIG. 3a) and the first exposure patterns. In other words, the second exposure patterns may be defined to comprise all the patterns of the target patterns (see FIG. 3a) and the first exposure patterns (see FIG. 3b).

Figure 3C:
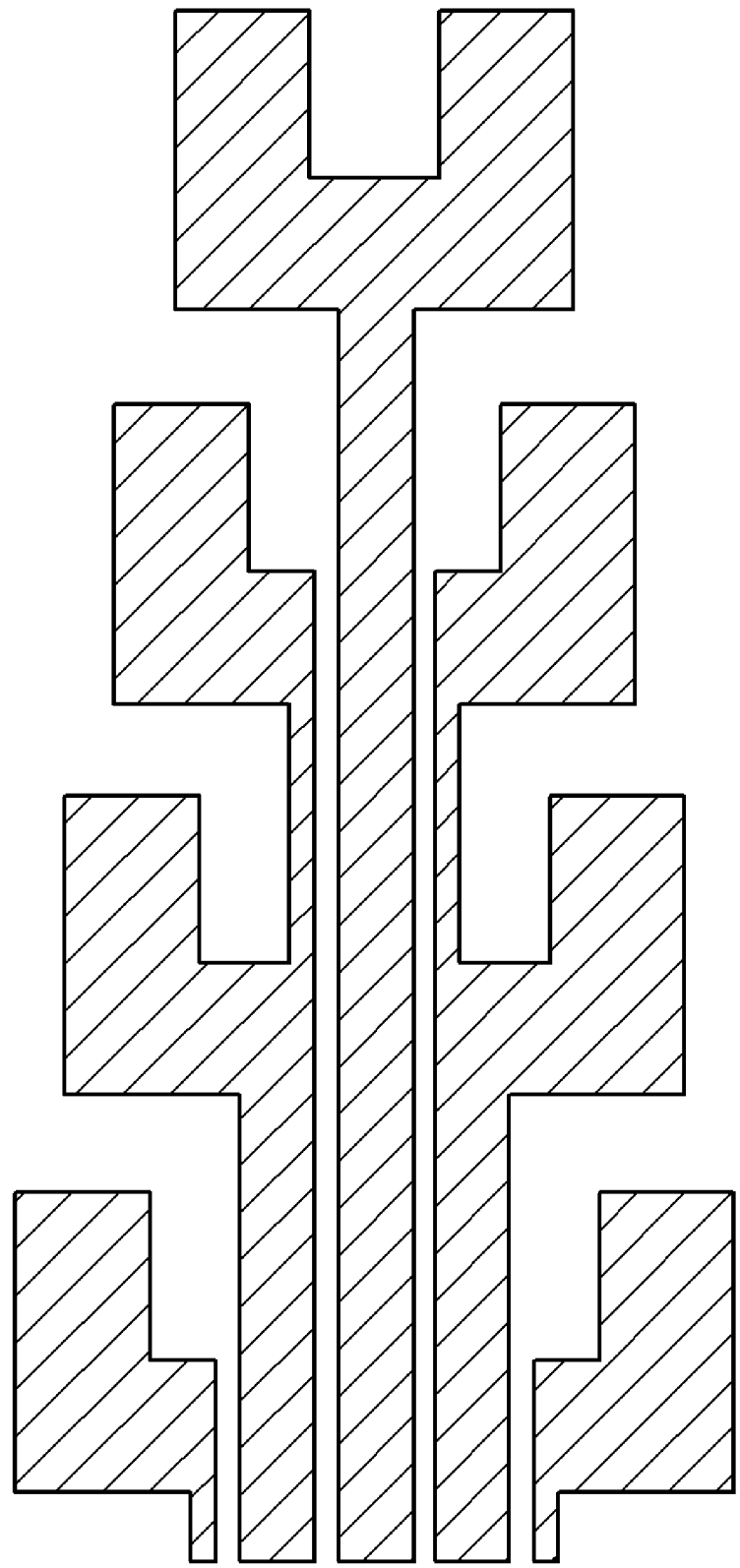
Figure 3D:
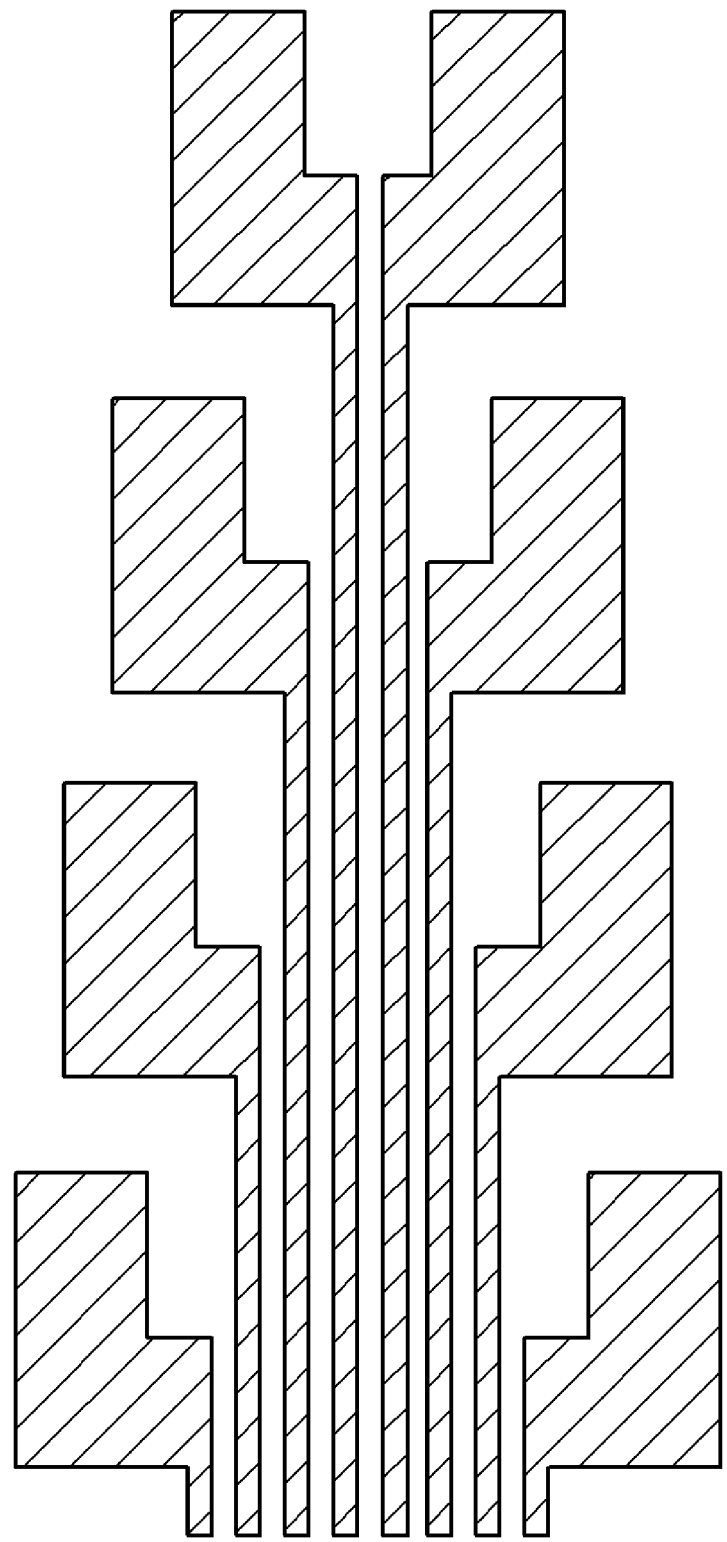
Figure 3E:
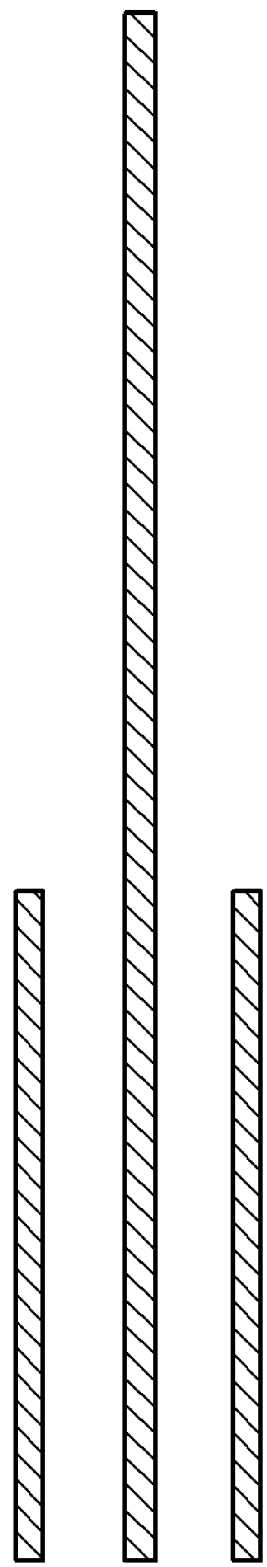
Figure 3F:
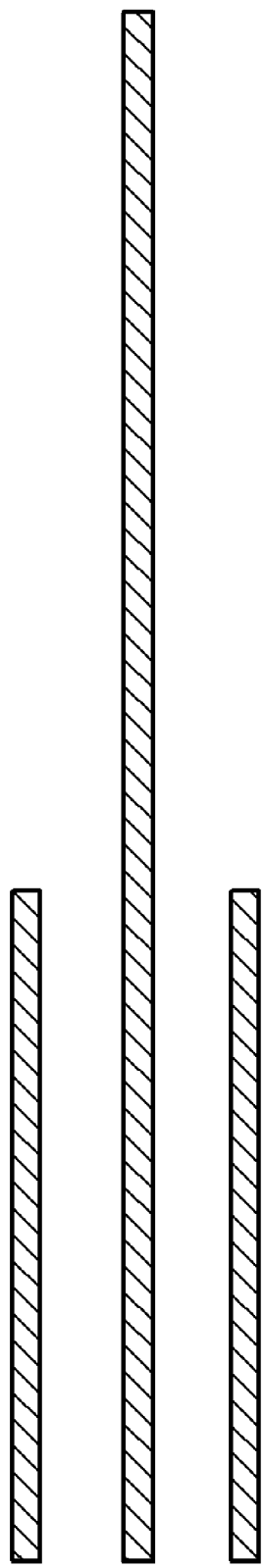

A determination is then made whether or not the patterns corresponding to the target patterns (see FIG. 3a) can be formed by performing the logic operation on the first exposure patterns (see FIG. 3b) and the second exposure patterns (see FIG. 3c).

For example, a logical exclusive disjunction (XOR) operation is performed on the first exposure patterns (see FIG. 3b) and the second exposure patterns (see FIG. 3c) to form third exposure patterns (see FIG. 3d) (103). A determination is then made whether or not the third exposure patterns (see FIG. 3d) are the same as the target patterns (see FIG. 3a) by comparing the third exposure patterns with the target patterns (see FIG. 3a).

If it is determined that the third patterns (see FIG. 3d) are different from the target patterns (see FIG. 3a), the procedure returns to the step of preparing the first exposure patterns.

If it is determined that the third patterns (see FIG. 3d) are the same as the target patterns (see FIG. 3a), optical proximity correction is performed on the first exposure patterns to form fourth exposure patterns (see FIG. 3e) (105).

Contour simulation is performed on the fourth exposure patterns (see FIG. 3e) to form the fourth contour-simulated exposure patterns (see FIG. 3f) (106).

Figure 3G:
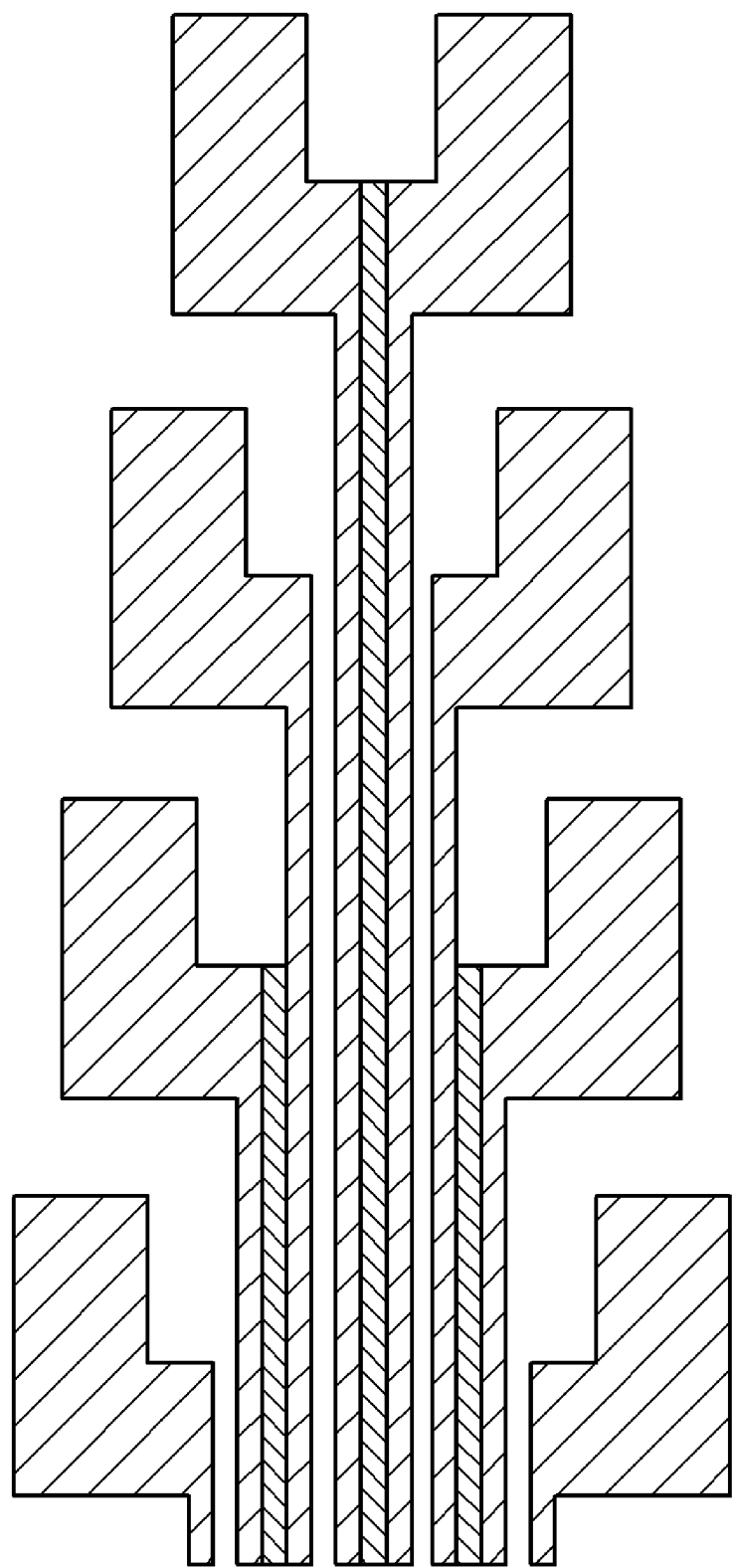
Figure 3H:
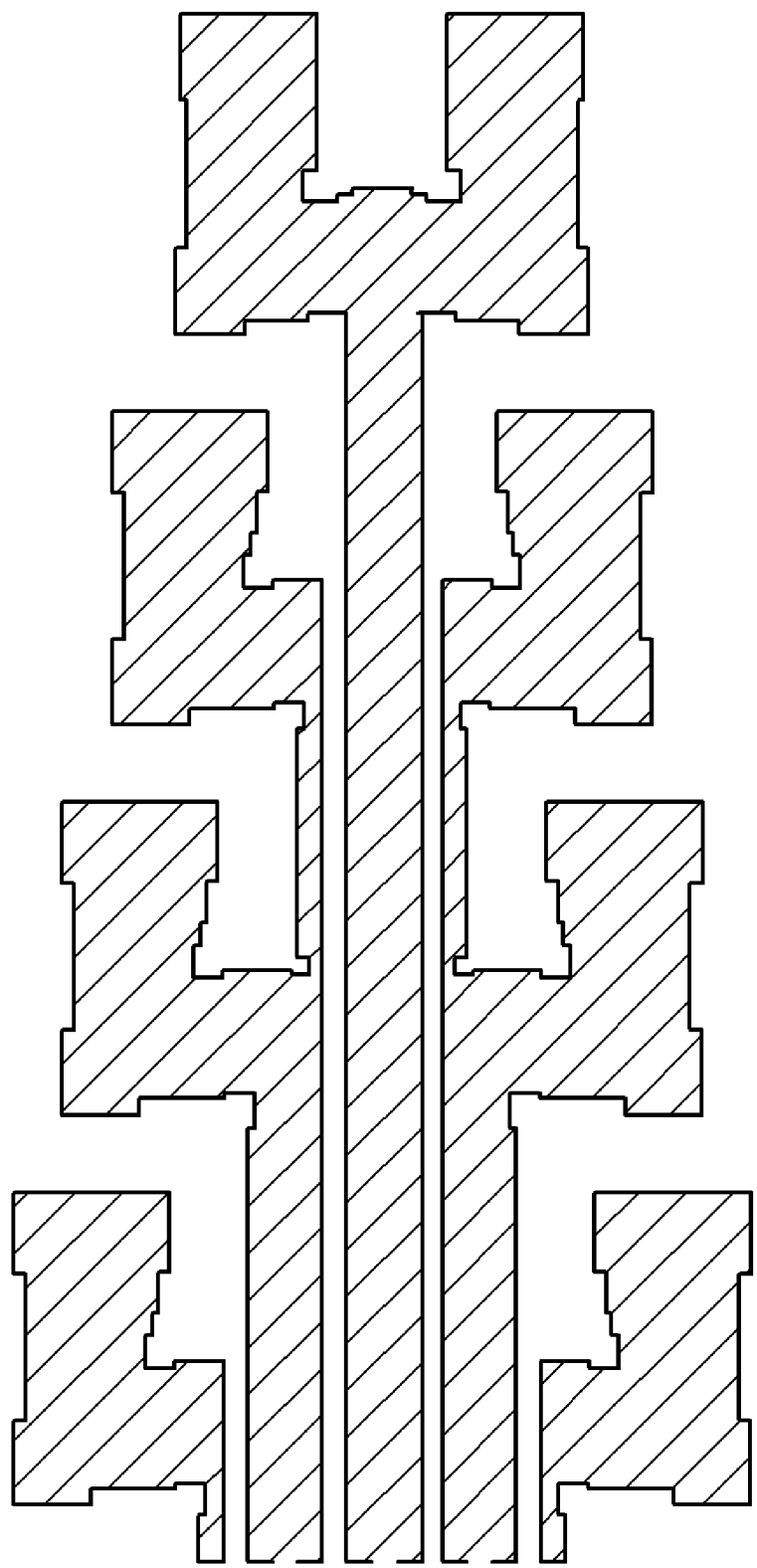

The second exposure patterns (see FIG. 3c) are merged with the fourth contour-simulated exposure patterns (see FIG. 3f) to form merged patterns (see FIG. 3g). Subsequently, the optical proximity correction is performed on the second exposure patterns (see FIG. 3c) to form fifth exposure patterns (see FIG. 3h) in consideration of overlap between the second exposure patterns (see FIG. 3c) and the merged patterns (see FIG. 3g) in order to complete desirable target patterns (107).

The fifth contour-simulated exposure patterns (see FIG. 3i) are obtained through the contour simulation of the fifth exposure patterns (see FIG. 3h) (108).

Figure 3I:
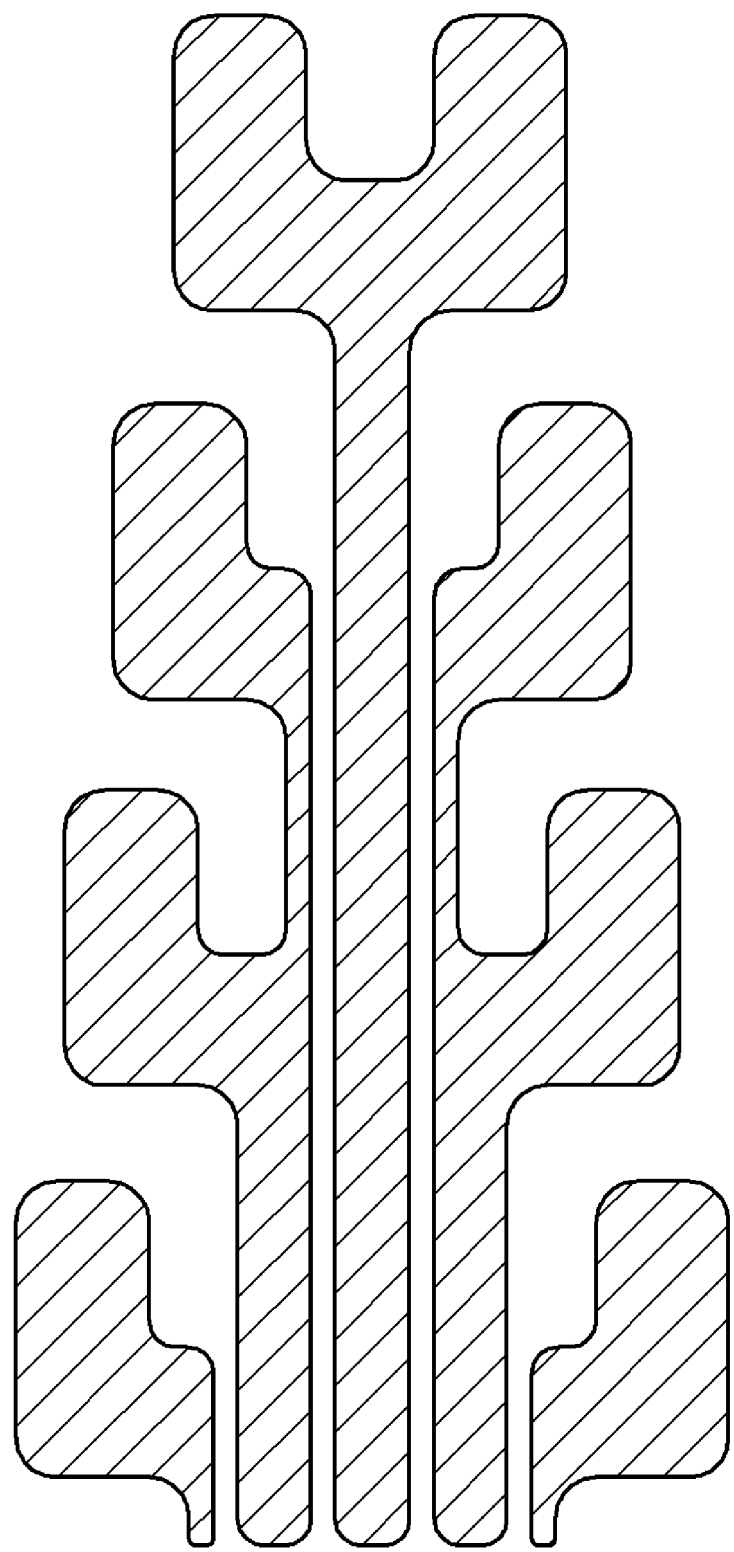
Figure 3J:
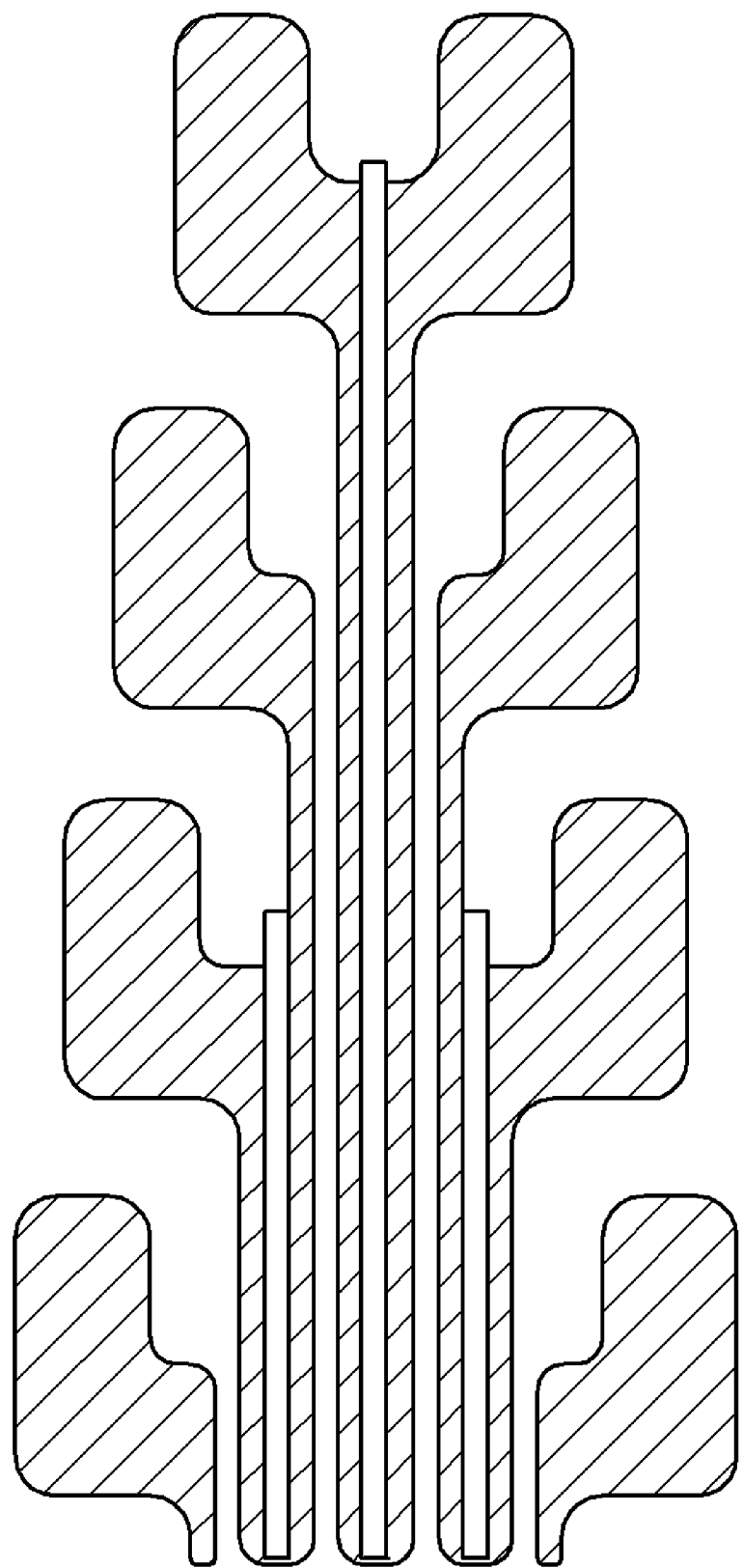

The fourth and fifth exposure patterns are then compared to the target patterns (see FIG. 3a) by performing a logical operation on the fourth contour-simulated exposure patterns (see FIG. 3f) and the fifth contour-simulated exposure patterns (see FIG. 3i).

For example, a logical exclusive disjunction (XOR) operation is performed on the fourth exposure patterns (see FIG. 3f) and the fifth exposure patterns (see FIG. 3i) to form sixth exposure patterns (see FIG. 3i) (109). A determination is then made whether or not the sixth exposure patterns (see FIG. 3i) are within an allowable range of error based on the comparison of the sixth exposure patterns (see FIG. 3i) with the target patterns (see FIG. 3a) (110).

If the sixth exposure patterns (see FIG. 3i) are not within the allowable range of error, the procedure returns to the step 107 to form the fifth exposure patterns (see FIG. 3h) again.

If the sixth exposure patterns (see FIG. 3i) are within the allowable range of error, the pattern decomposition and optical proximity correction is completed.

As is apparent from the above description, according to the invention, it is possible to automatically separate target patterns and confirm the separated target patterns for double exposure. In addition, it is possible to confirm the patterns for final double exposure through simulation by performing optical proximity correction and contour simulation corresponding to the pattern decomposition for the double exposure. With these processes, the pattern decomposition and optical proximity correction can be easily performed within a short period of time.

It should be understood that the embodiments and the accompanying drawings have been described for illustrative purposes and the present invention is limited only by the following claims. Further, those skilled in the art will appreciate that various modifications, additions and substitutions are allowed without departing from the scope and spirit of the invention according to the accompanying claims.

What is claimed is:

1. A pattern decomposition and optical proximity correction method for double exposure when forming photomasks, comprising:
   defining first exposure patterns by separating patterns requiring the double exposure from target patterns depending on the resolution of an exposing apparatus;
   defining second exposure patterns by performing a logic operation on the target patterns and the first exposure patterns;
   comparing the first and second exposure patterns with the target patterns by performing a logic operation on the first and second exposure patterns;
   performing optical proximity correction on the first exposure patterns to form fourth exposure patterns;
   performing optical proximity correction on the second exposure patterns to form fifth exposure patterns; and
   comparing the fourth and fifth exposure patterns with the target patterns by performing a logic operation on the fourth and fifth exposure patterns.

2. The method according to claim 1, wherein defining the first exposure pattern comprises:
   identifying fine patterns having a pitch smaller than the resolution of the exposing apparatus;
   selecting a predetermined pattern among the identified fine patterns; and
   selecting other patterns that are separated at least a predetermined distance from the predetermined pattern to define the first exposure patterns.

3. The method according to claim 2, wherein the other patterns selected as the first exposure patterns are separated from each other by a distance of at least four times the width of each of the other patterns.

4. The method according to claim 1, wherein defining the second exposure patterns comprises performing a logical disjunction (OR) operation on the target patterns and the first exposure patterns.

5. The method according to claim 1, wherein comparing the first and second exposure patterns with the target patterns comprises:
   performing a logical exclusive disjunction (XOR) operation on the first and second exposure patterns to form third exposure patterns; and
   comparing the third exposure patterns with the target patterns.

6. The method according to claim 1, wherein the optical proximity correction on the second exposure patterns is performed in consideration of overlap between the second exposure patterns and the fourth exposure patterns.

7. The method according to claim 6, further comprising:
   performing contour simulation on the fourth exposure patterns between formation of the fourth exposure patterns and formation of the fifth exposure patterns.

8. The method according to claim 1, wherein comparing the fourth and fifth exposure patterns with the target patterns comprises:
   performing a logical exclusive disjunction (XOR) operation on the fourth and fifth exposure patterns to form sixth exposure patterns; and
   confirming whether or not the sixth exposure patterns are within an allowable range of error by comparing the sixth exposure patterns with the target patterns.

9. The method according to claim 8, further comprising:
   performing contour simulation on each of the fourth and fifth exposure patterns before performing the logical exclusive disjunction (XOR) operation on the fourth and fifth exposure patterns.

10. A pattern decomposition and optical proximity correction method for double exposure when forming photomasks, comprising:

defining first exposure patterns by separating patterns requiring the double exposure from target patterns depending on the resolution of an exposing apparatus;

defining second exposure patterns by performing a logical operation on the target patterns and the first exposure patterns;

comparing the first and second exposure patterns with the target patterns by performing a logical operation on the first and second exposure patterns;

performing optical proximity correction on the first exposure patterns to form fourth exposure patterns;

performing contour simulation on the fourth exposure patterns;

merging the second exposure patterns with the fourth contour-simulated exposure patterns to form merged patterns;

performing the optical proximity correction on the second exposure patterns to form fifth exposure patterns in consideration of overlap between the second exposure patterns and the merged patterns;

performing the contour simulation on the fifth exposure patterns; and comparing the fourth and fifth exposure patterns with the target patterns by performing a logical operation on the fourth and fifth contour-simulated exposure patterns.

11. The method according to claim 10, wherein defining the first exposure patterns comprises:

identifying fine patterns having a pitch smaller than the resolution of the exposing apparatus;

selecting a predetermined pattern among the identified fine patterns; and selecting other patterns separated at least a predetermined distance from the predetermined pattern to define the first exposure patterns.

12. The method according to claim 11, wherein the other patterns selected as the first exposure patterns are separated from each other by a distance of at least four times the width of each of the other patterns.

13. The method according to claim 10, wherein defining the second exposure patterns comprises performing a logical disjunction (OR) operation on the target patterns and the first exposure patterns.

14. The method according to claim 10, wherein comparing the first and second exposure patterns with the target patterns comprises:

performing a logical exclusive disjunction (XOR) operation on the first and second exposure patterns to form third exposure patterns; and comparing the third exposure patterns with the target patterns.

15. The method according to claim 10, wherein comparing the fourth and fifth exposure patterns with the target patterns comprises:

performing a logical exclusive disjunction (XOR) operation on the fourth and fifth exposure patterns to form sixth exposure patterns; and confirming whether or not the sixth exposure patterns are within an allowable range of error by comparing the sixth exposure patterns with the target patterns.

* * * * *